United States Patent [19]

Katsuto et al.

[11] 4,214,926

[45] Jul. 29, 1980

[54] METHOD OF DOPING IIB OR VIB GROUP ELEMENTS INTO A BORON PHOSPHIDE SEMICONDUCTOR

[75] Inventors: Nagano Katsuto, Yokohama; Sasa Syozo, Ichikawa; Nakada Takeshi, Tokyo; Asakawa Yukio, Chiba, all of Japan

[73] Assignee: TDK Electronics Co., Ltd., Tokyo, Japan

[21] Appl. No.: 971,440

[22] Filed: Dec. 20, 1978

Related U.S. Application Data

[63] Continuation of Ser. No. 810,097, Jun. 27, 1977, abandoned.

[30] Foreign Application Priority Data

Jul. 2, 1976 [JP] Japan .................................. 51/78726
Jul. 2, 1976 [JP] Japan .................................. 51/78727

[51] Int. Cl.² .................. H01L 21/205; H01L 29/207
[52] U.S. Cl. ..................................... 148/175; 148/174; 156/605; 156/613; 252/62.3 GA; 427/85; 427/87; 357/16; 357/61
[58] Field of Search ................. 148/1.5, 174, 175; 252/62.3 GA; 156/605, 613; 423/289, 295; 427/85, 87; 357/16, 61

[56] References Cited

U.S. PATENT DOCUMENTS

| 3,146,137 | 8/1964 | Williams | 148/175 |
|---|---|---|---|
| 3,364,084 | 1/1968 | Ruehrwein | 148/175 |
| 3,433,684 | 3/1969 | Zanowick et al. | 357/16 X |
| 3,492,175 | 1/1970 | Conrad et al. | 148/175 |
| 3,634,872 | 1/1972 | Umeda | 148/175 X |
| 3,687,744 | 8/1972 | Ogirima et al. | 148/175 |
| 3,699,401 | 10/1972 | Tietjen et al. | 357/16 X |
| 3,725,749 | 4/1973 | Groves et al. | 148/175 X |
| 3,877,060 | 4/1975 | Shono et al. | 148/175 X |

FOREIGN PATENT DOCUMENTS

| 1011979 | 12/1965 | United Kingdom | 148/175 |
|---|---|---|---|
| 1319559 | 6/1973 | United Kingdom | 156/612 |
| 1319560 | 6/1973 | United Kingdom | 156/612 |

OTHER PUBLICATIONS

Tietjen et al., "Preparation . . . Epitaxial GaAsP . . . Arsine and phosphine" J. Electrochem. Soc., vol. 113, No. 7, Jul. 1966, pp. 724–728.
Manasevit et al., "use of Metal-Organics . . . Semiconductor Materials"
Ibid., vol. 116, No. 12, Dec., 1969, pp. 1725–1732.
Burmeister et al., "Large Area Epitaxial Growth . . . GaAsP . . . " Trans. Metall. Soc. Aime, vol. 245, Mar. 1969, pp. 587–592.
Chu et al., "Growth of Boron Monophosphide . . . Technique" J. Crystal Growth, V. 33 (1976), pp. 53–57.

Primary Examiner—R. Dean
Assistant Examiner—W. G. Saba
Attorney, Agent, or Firm—Burgess, Ryan and Wayne

[57] ABSTRACT

A method of doping IIb or VIb group elements into a phosphide semiconductor comprising the steps of adding organic compounds of IIb group elements or hydrides of VIb group elements to a gas containing boron compounds selected from the group consisting of boron hydrides and boron halides and phosphorus compounds selected from the group consisting of phosphorus hydrides and phosphorus halides, in a ratio of 0.05–50 mol of said IIb group organic compounds or $10^{-4}$–10 mol of said VIb group hydrides per mol of said boron compounds, and conducting vapor phase growing of the boron phosphide semiconductor at a growing temperature between about 850° and 1100° C.

7 Claims, 2 Drawing Figures

4,214,926

METHOD OF DOPING IIB OR VIB GROUP ELEMENTS INTO A BORON PHOSPHIDE SEMICONDUCTOR

This is a continuation of application Ser. No. 810,097, filed June 27, 1977, now abandoned.

BACKGROUND OF THE INVENTION

The present invention relates to a method of doping a IIb or VIb group element into a boron phosphide semiconductor and, in particular, it relates to a method of doping a IIb group acceptor impurity element or a VIb group donor impurity element in the vapor phase growth of boron phosphide by incorporating trace amounts of organic compounds of a IIb group element or hydrides of a VIb group element in the reaction gas.

It has been difficult to obtain a high quality boron phosphide crystal since the crystal growth thereof is more difficult as compared with other III, VI and V group elements such as GaAs, GaP and like. Consequently, an extreme difficulty is present in the method of impurity doping to form an acceptor level due to the IIb group element impurity or a donor level due to the VIb group element impurity.

SUMMARY OF THE INVENTION

It is, accordingly, an object of the present invention to provide a novel method of doping a IIb or VIb group element into a boron phosphide semiconductor.

It is another object of the present invention to provide a method for effecting the vapor phase growth of a P or N type boron phosphide epitaxial layer at a high quality.

The foregoing objects can be attained by a method of doping a IIb or VIb group element into a boron phosphide semiconductor which comprises the steps of adding organic compounds of a IIb group element or hydrides of a VI group element to a gas containing a boron compound selected from the group consisting of boron hydrides and boron halides and a phosphorus compound selected from the group consisting of phosphorus hydrides and phosphorus halides in a ratio of 0.05–50 mol of said IIb group organic compounds or $10^{-4}$–10 mol of said VIb group hydrides per mol of said boron compound, and effecting the vapor phase growth for the boron phosphide semiconductor at a growing temperature between about 850°–1100° C.

According to the method of the present invention, in view of the difficulty for the foregoing impurity doping, organic metal compounds of a IIb group element as a source for acceptor impurity or hydrides of a VIb group element as a source for donor impurity are incorporated in a trace amount together with reaction gas in the course of the vapor phase growth of boron phosphide, whereby the IIb or VIb group element is electrically activated stably and introduced into boron phosphide as an acceptor or a donor thereby facilitating the vapor phase growth of a P type or an N type boron phosphide epitaxial layer at a satisfactory quality.

BRIEF DESCRIPTION OF THE DRAWINGS

The present invention will be understood best in connection with accompanying drawings, wherein.

DESCRIPTION OF THE PREFERRED EMBODIMENTS

Figure 1:
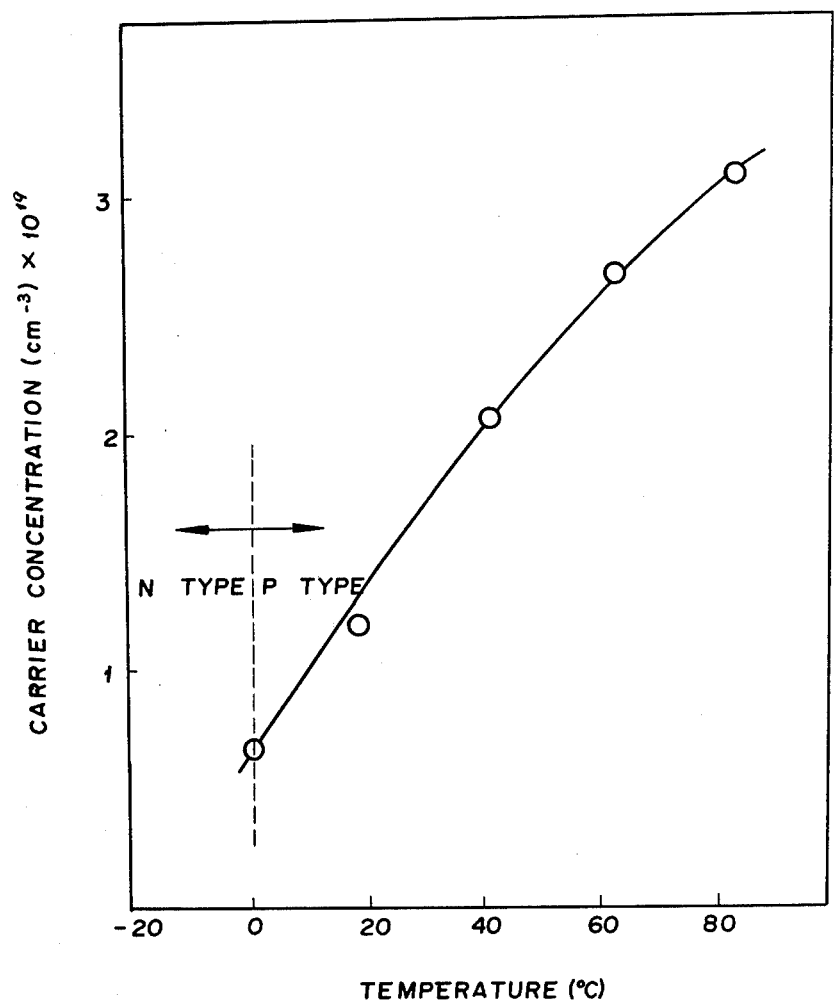
FIG. 1 is a graph representing the relation between temperature of liquid diethyl zinc and carrier concentration of boron phosphide grown layer.

The reaction gas used for the vapor phase growing of boron phosphide in the present invention includes the combinations of boron and phosphorus hydrides, boron and phosphorus halides, boron hydride and phosphorus halide, and boron halide and phosphorus hydride. The typical boron hydrides include those represented by $B_nH_{n+4}$ such as diborane ($B_2H_6$), $B_5H_9$ and $B_{10}H_{14}$, and $B_nH_{n+6}$ such tetraborane ($B_4H_{10}$) and $B_5H_{11}$. The phosphorus hydrides include phosphine ($PH_3$) and diphosphine ($P_2H_5$). Preferred halogens in the boron and phosphorus halides are those having 17–53 atomic number and the preferred halides are chloride and bromides. The typical halides include boron trichloride ($BCl_3$), boron tribromide ($BBr_3$), boron triiodide ($BI_3$), phosphorus trichloride ($PCl_3$), phosphorus tribromide ($PBr_3$), phosphorus triiodide ($PI_3$), phosphorus pentachloride ($PCl_5$), phosphorus pentabromide ($PBr_3$), phosphorus pentaiodide ($PI_5$), and the like.

Hydrogen, nitrogen or the like is incorporated as a carrier into the reaction gas. The epitaxial growth of the boron phosphide is conducted by contacting the reaction gas with the surface of a substrate used for the crystal growth heated to a high temperature, such as a (100), (110) or (111) face of BP, Si and spinel or a (1$\bar{1}$02) face of sapphire. The organic compounds of IIb group acceptor-forming element or hydrides of VIb group donor-forming element are added to the reaction gas thereby introducing such impurity element in the growing stage of boron phosphide.

The impurity doping is conducted at a growing temperature between about 850°–1100° C. Where boron and phosphorus as the essential ingredients in the reaction gas are used both in hydride form, the doping is effected with a composition ratio $PH_3/B_2H_6 = 10-400$ at a growing temperature between about 850°–1100° C., and where boron and phosphorus both or either of them being in halide form are used, the doping is effected with the same composition ratio at a growing temperature between about 950°–1100° C. The amounts of the doping agents introduced into the reaction gas are 0.05–50 mol with the organic compound of IIb group element and $10^{-4}$–10 mol with the hydride of VIb group element per mol of the boron compound. The organic compound as an impurity source is kept in a liquid state. The amount of the impurity to be supplied to the reaction gas is varied by controlling the vapor pressure of the liquid compound by a change in the liquid temperature and by controlling the flow rate of carrier gas for picking-up the organic compound. The hydride of VIb group element as an impurity source is in the vapor state at a normal temperature. The amount of VIb group element supplied from the hydride to the boron phosphide, as the impurity, is controlled by adding a desired amount to the reaction gas through a flowmeter.

The IIb group elements include include zinc, cadmium and mercury and the organic compounds thereof include those organometallic compounds represented by the general formula:

wherein M represents zinc, cadmium mercury, R is a hydrocarbon radical, for example, alkyl, alkenyl or aryl having 1-20 carbon atoms and R' has the same contents as R or represents halogen, for example, Cl Br or I. They specifically include, for example, dimethylzinc, diethylzinc, di-n-propylzinc, diisopropylzinc, di-n-butylzinc, di-sec-butylzinc, dioctylzinc, didecylzinc, didodecylzinc, distearylzinc, dipropenylzinc, diphenylzinc, dimethylcadmium, diethylcadmium, din-propylcadmium, di-n-butylcadmium, dioctylcadmium, didodecylcadmium, dipropenylcadmium, diphenylcadmium, dimethylmercury, diethylmercury, di-n-propylmercury, diisopropylmercury, di-n-butylmercury, dioctylmercury, didodecylmercury, diphenylmercury, methylmercury choride, methylmercury bromide, methylmercury iodide, ethyl-mercury chloride, ethylmercury bromide, n-propylmercury chloride, isopropylmercury chloride, n-butylmercury chloride and the like. The organometallic compounds wherein R is alkyl having 1-4 carbon atoms and R' is alkyl having 1-4 carbon atoms or chlorine or bromine are preferred. In the impurity doping to boron phosphide, a mixture of doping gases comprising two or more types of impurity elements may be used.

The VIb group element includes sulfur, selenium, and tellurium. The hydrides thereof include hydrogen sulfide, hydrogen selenide ($H_2Se$) and hydrogen telluride ($H_2Te$). The doping of the above impurity into the boron phosphide can also be effected by the use of a mixture of doping gases comprising two or more types of the impurity elements.

The impurity sources are usually used diluted with gas such as hydrogen, nitrogen, helium, argon or the like. The doping gas decomposes at a substrate to deposit the impurity element thereon, which is then charged into boron phosphide to form an acceptor or a donor level in the course of vapor phase growing.

In producing P type boron phosphide semiconductors through epitaxial growth of boron phosphide semiconductor by the use of phosphorus trichloride and diborane, a particularly satisfactory result is attainable according to the present invention by carrying out the crystal growth using nitrogen, or rare gas containing less than 90% by volume of hydrogen, or the mixture thereof as the carrier gas, with a composition ratio of phosphorus trichloride to diborane at about 20-200 and at a substrate temperature between about 880°-1100° C.

The P type boron phosphide semiconductor layer thus produced forms a specular surface and has an excellent crystalline structure, and Kikuchi bands are observed by way of reflecting electron diffraction. A mobility as high as 50 cm$^2$/V sec. (1µ thick) is obtained. Since diborane forms a rate-determining step in the growing velocity of boron phosphide semiconductor layer, the film thickness can be controlled exactly by merely controlling the amount of diborane.

Single crystal plates used herein include those substrates made of silicon, germanium, silicon carbide, sapphire, spinel and the like, as well as composite semiconductor substrates having a single crystal layer of boron phosphide previously formed thereon from hydride system. While any of the face indices (100), (110) and (111) can be used for the semiconductor substrate, best crystallinity is obtained with the semiconductor layer of the boron phosphide formed on a (100) face. Particularly, a BP/Si composite semiconductor substrate composed of a silicon substrate having boron phosphide formed thereon provides an excellent crystallinity for a wide range under the growing conditions according to the present invention.

The present invention has been accomplished on the finding that while a conduction type N is provided where a semiconductor layer of boron phosphide is formed by using only hydrogen as a carrier gas, a conduction type P is provided where the hydrogen contains more than 10% by volume of nitrogen or rare gas such as xenon, argon, helium and the like. Although a layer formed at a growing temperature between about 880°-1100° C. has a single crystal structure, preferred layers are those formed in a range between about 950°-and 1050° C. Moreover, while the single crystal is obtained with a phosphorus trichloride to diborane ratio ($PCl_3/B_2H_6$) between about 2-200, those layers grown with a composition ratio of between about 10-200 provide excellent crystallinity and electrical properties.

The concentration of diborane to the reaction gas used lies in the range of $2\times10^{-6} - 5\times10^{-3}$ mol/mm.

EXAMPLE 1

Impurity doping by the method according to the present invention is to be described by way of an example where vapor phase growing of boron phosphide (BP) was conducted on a Si substrate using $B_2H_6$, $PH_3$ and $H_2$ as reaction gas simultaneously with the conduction of Zn impurity doping using diethylzinc.

A Si substrate having (100), (110) or (111) face subjected to mirror polishing was placed on a SiC coated carbon susceptor and heated to a growing temperature of 930° C. by way of radio frequency induction heating means provided to a quartz reaction tube thereby effecting epitaxial growth under the conditions of $B_2H_6$ concentration at $2\times10^{-5}$ mol/min and with a $PH_3/B_2H_6$ ratio (molar ratio)=1:50. The temperature of liquid diethylzinc contained in a stainless bubbler was kept at a desired point in the range of $-20°$ to 50° C. to control the vapor pressure of the diethylzinc during the epitaxial growing. Hydrogen ($H_2$) was supplied as pick-up gas in a desired rate between 5-100 cc/min, led to the quartz reaction tube by way of a stainless pipe kept at about 90° C. for the introduction of the reaction gas and then mixed with the reaction gas. The amount of diethylzinc (DEZ) supplied was controlled so as to provide a $DEZ/B_2H_6$ ratio (molar ratio)=5.0.

The Zn-doped vapor phase grown BP layer has a 2µ film thickness. After the growing, the substrate Si was removed through etching by HF-HNO$_3$ mixed acid and the carrier density was measured based on Van Der Pauw method. The Zn-doped layer supplied with diethylzinc in excess of a certain amount exhibited a conduction type P. The vapor grown BP layer not doped with zinc showed a conduction type N and the carrier density was less than $5\times10^{16}$.cm$^{-3}$. FIG. 1 shows the relation between the liquid temperature of diethylzinc and the carrier concentration in the grown BP layer. As can be seen from FIG. 1, P type layer was not obtained at the liquid temperature below 0° C. At a temperature above 10° C., the carrier density increased with the rise in the liquid temperature. According to the reflecting electron diffraction, no substantial degradation in the vapor phase grown BP layer due to the addition of diethylzinc was observed. No satisfactory Zn doping could be effected under the conditions other than the foregoing temperature range for the crystal growth and the range for DEZ/B$_2$H$_6$ (molar ratio). The Zn contents in the grown BP layer measured by way of an x-ray microanalyzer was substantially corresponded to the carrier concentration measured electrically.

EXAMPLE 2

Cadium element was doped from diethylcadmium (DECd) into boron phosphide by the same reaction gas heating process as in the Example 1 using BP (100) face as a substrate for the crystal growth. Epitaxial growing was conducted on (100) face of a BP substrate on a Si substrate under the condition of B$_2$H$_6$ concentration at $2 \times 10^{-5}$ mol/min at a growing temperature of 930° C. and with a PH$_3$/B$_2$H$_5$ ratio = 1:50 (molar ratio). DECd was incorporated in a trace amount to the reaction gas in the same way as in the Example 1 by using hydrogen as pick-up gas while controlling the vapor pressure of liquid DECd by the change in the liquid temperature. Vapor phase growing of BP was conducted while keeping the ratio between the amounts of DECd and B$_2$H$_6$ supplied to DECd/B$_2$H$_6$ = 1:5 (molar ratio). The resulted BP grown layer showed a conduction type P and the carrier density therein was $2 \times 10^{19}$ cm$^{-3}$. An X-ray microanalyzer detected about $10^{19} \times$ cm$^{-3}$ of cadium in the BP film. The carrier density in non-doped BP films was always less than $5 \times 10^{16}$.cm$^{-3}$.

So long as the amount of DECd was kept unchanged (DECd/B$_2$H$_6$ = 1:5), the carrier density showed no substantial changes remaining at about $2 \times 10^{19}$ cm$^{-3}$ within a growing temperature range of 850°–1000° C.

Where the doping experiment was conducted while varying the molar ratio DECd/B$_2$H$_6$ between 0.05 and 50 under the conditions of growing temperature at 930° C. and B$_2$H$_6$ concentration at $2 \times 10^{-5}$ mol/min, a tendency similar to that of the Experiment 1 shown in FIG. 1 was found between the amount of DECd supplied and the carrier density.

EXAMPLE 3

Zn was doped into BP using B$_2$H$_6$—PCl$_3$—H$_2$ as the reaction gas and by adding DEZ to the reaction gas in the same was as in the Example 1. A Si substrate having a P-doped (100) face was placed on a SiC coated carbon susceptor and heated to a growing temperature set to 1000° C. by way of radio frequency induction heating, and B$_2$H$_6$ was introduced at a concentration of $2 \times 10^{-5}$ mol/min into a quartz reaction tube together with H$_2$ as carrier gas. Phosphorus trichloride (PCl$_3$) was bubbled by introducing H$_2$ therein as the pick-up gas while controlling the vapor pressure of PCl$_3$ by the change in the liquid temperature and then mixed with the carrier gas. The composite ratio of PCl$_3$/B$_2$H$_6$ (molar ratio) was 25. At the same time, diethylzinc (DEZ) was introduced into the reaction gas in the same manner as in the Example 1 at DEZ/B$_2$H$_6$ (molar ratio) = 5 to conduct the charging of Zn impurity. As the result, a P type BP epitaxial layer in 2 micron thick was obtained. The carrier density was $2 \times 10^{19}$ cm$^{-3}$. A BP grown layer with no Zn doping had a conduction type N and a carrier density less than $5 \times 10^{17}$ cm$^{-3}$. The growing temperature was varied in the Zn doping and the electrical properties of the grown BP layers were measured to find that while satisfactory Zn-doped layers could be obtained within the temperature range between 950°–1100° C. and DEZ/B$_2$H$_6$ molar ratio between 0.05 and 50, the properties of the doped layers were significantly degraded out of the above ranges. Satisfactory Zn doping into BP was also observed for the BCl$_3$—PCl$_3$—H$_2$ system carrier gas under substantially the same ranges for the growing temperature and DEZ/B$_2$H$_6$ molar ratio. There were no differences in the doping effects of IIb group element into BP with respect to face indices (111) and (110) both in the Examples 1 and 2.

As apparent from the foregoing Examples 1 through 3, production of a P type layer in the epitaxial vapor phase growth of BP was enabled by the doping of the IIb group element from the IIb organic compound into BP, which provides a great industrial advantage in preparing PN junction devices by way of BP.

The doping of the IIb group element by the process according to the present invention resulted a quite similar effect also by conducting the doping to a Si substrate already having a BP epitaxial layer formed thereon through vapor growth.

EXAMPLE 4

Description will now be made in this example for the case where BP vapor phase growing is effected on a Si substrate by using B$_2$H$_6$, PH$_3$ and H$_2$ as the reaction gas, simultaneously with the impurity doping of VIb group elements of S, Se and Te from VIb group hydrides: H$_2$S, H$_2$Se and H$_2$Te.

A Si substrate having (100), (110) and (111) faces subjected to mirror polishing was placed on a SiC-coated carbon susceptor and kept at a growing temperature of 930° C. by way of radio frequency induction heating and caused to grow epitaxially in vapor phase under the conditions of B$_2$H$_6$ concentration at $2 \times 10^{-5}$ mol/min, and PH$_3$/B$_2$H$_6$ molar ratio at 50. At the same time, VIb group hydrides diluted with H$_2$ were mixed with the reaction gas and introduced into a quartz reaction tube while controlling the amount supplied by way of a flowmeter. The BP vapor phase grown layer doped with VIb group elements from VIb group hydrides had a film about 2$\mu$ in thick. After the completion of the growing, silicon as the substrate was removed through etching by the use of mixed acid composed of HF—HNO$_3$ and the carrier concentration was measured by the Van der Pauw method. The BP layer doped with the VIb group elements exhibited a conduction type N. A non-doped vapor phase grown layer not doped with the VIb group elements exhibited a conduction type N and had the carrier concentration less than $5 \times 10^{16}$ cm$^{-3}$. Gas flow rates 100 cc/min, 500 cc/min and 1000 cc/min indicative of the carrier density for the BP vapor phase grown layer and obtained by varying the amount of the doping gas supplied composed of VIb hydrides: H$_2$S, H$_2$Se and H$_2$Te diluted with H$_2$ to 300 ppm are shown in table 1 below, and these flow rates respectively correspond to VIb hydride/B$_2$H$_6$ molar ratio of: 0.067, 0.33 and 0.67. As can be seen from the table 1, the carrier concentration increased with the increase in the amount of the VIb group hydrides supplied. Reflecting electron diffraction showed no degradation resulted from VIb element doping in the vapor phase grown BP layer. The amounts of S, Se and Te in the grown BP layer measured by a mass spectrum analyzer and an X-ray micronanalyzer were substantially corresponded to the carrier concentration measured electrically.

Table 1

Relation between the flow rate of VIb group hydrides and the carrier concentration

| Carrier density | | Flow rate of VIb group hydrides (cc): on 300 ppm $H_2$ base | | |
|---|---|---|---|---|
| | | 100 | 500 | 1000 |
| Impurity doping gas | $H_2S$ | $8 \times 10^{17}$ | $5 \times 10^{18}$ | $9 \times 10^{18}$ |
| | $H_2Se$ | $1.5 \times 10^{18}$ | $8 \times 10^{18}$ | $1.5 \times 10^{19}$ |
| | $H_2Te$ | $2 \times 10^{18}$ | $1 \times 10^{19}$ | $1.5 \times 10^{19}$ |

EXAMPLE 5

VIb group elements were doped into BP in the same way as in the Example 4 by using $B_2H_6$—$PCl_3$—$H_2$ as the reaction gas and by incorporating VIb group hydrides in a trace amount. A BP substrate having a (100) face for the growth of crystal was placed on a SiC-coated carbon susceptor and kept at a growing temperature of 1000° C. by way of radiation frequency induction heating and $B_2H_6$ at a concentration of $2 \times 10^{-5}$ mol/min was introduced into a quartz reaction tube together with $H_2$ carrier gas. Phosphorus trichloride ($PCl_3$) was bubbled by introducing $H_2$ as pick-up gas in a bubbler where the vapor pressure of $PCl_3$ was controlled by the changes in the liquid temperature and then mixed with the carrier gas. The ratio between phosphorus trichloride and diborane: $PCl_3/B_2H_6$ was 2.5 (molar ratio). VIb group hydrides were charged into the reaction gas at the same time in the same way as in the Example 4 to effect the impurity charging of the VIb group elements. As the result, a BP epitaxial layer having a conduction type N was obtained in a thickness of $2\mu$. The carrier concentration for the vapor phase grown BP layer prepared by using $H_2S$, $H_2Se$ and $H_2Te$ diluted with $H_2$ to 300 ppm as the impurity doping gas under the conditions of molar ratios $H_2S/B_2H_6=0.067$, $H_2Se/B_2H_6=0.067$ and $H_2Te/B_2H_6=0.067$ were $1.5 \times 10^{19}$ cm$^{-3}$, $1.7 \times 10^{19}$ cm$^{-3}$ and $2.0 \times 10^{19}$ cm$^{-3}$ respectively. The carrier density in the grown BP layer where the VIb group element doping was not effected was less than $5 \times 10^{17}$ cm$^{-3}$ and the layer had a conduction type N. The BP vapor phase growing was repeated while varying the amounts of the VIb group hydrides supplied, and the electrical properties of the resulted BP layer were measured and the VIb group elements in the grown layer was analyzed. As the result, it was found that while satisfactory layer doped with VIb group elements was obtained within the ranges for temperature between 950°-1100° C. and the molar ratio between VIb group hydrides/$B_2H_6 = 10^{-4} - 10$, the properties of the layer significantly degraded outside of the foregoing ranges.

There are no differences for the doping effects of VIb group elements to BP with respect to face indeces, (111) and (110) both in the Examples 4 and 5. Doping of VIb group elements into BP by the method according to the present invention resulted a quite similar effect also by the conduction of the doping on a Si substrate already having thereon a BP epitaxial layer formed through vapor phase growing.

As apparent from the foregoing Examples 4 and 5, production of a N type layer in the epitaxial growing of BP is enabled by doping VIb group elements into BP from VIb group hydrides, which provides a great industrial advantage in the preparation of PN junction devices by way of BP.

EXAMPLE 6

Figure 2:
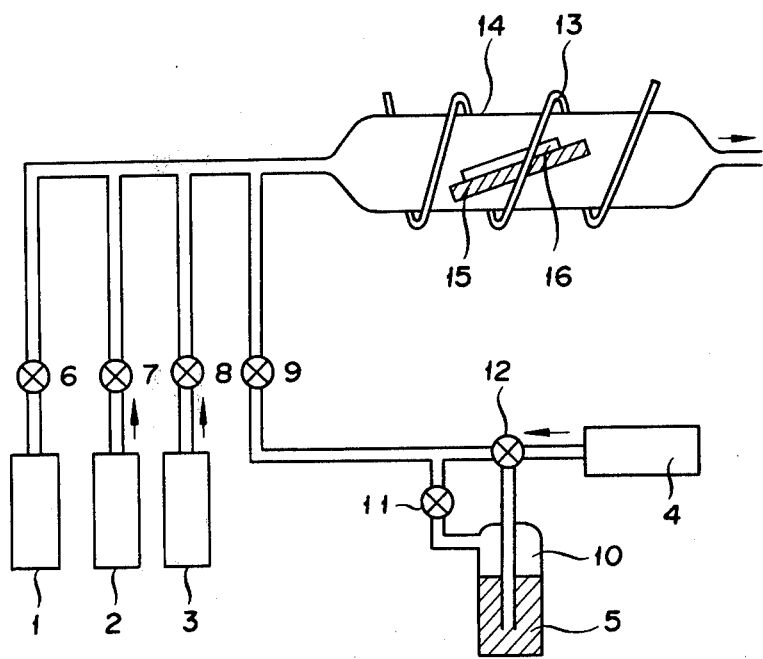
FIG. 2 is a schematic view showing one example of an apparatus for growing boron phosphide semiconductor according to the present invention.

FIG. 2 shows a schematic view of a growing apparatus for a boron phosphide semiconductor according to the present invention. A phosphorus (P)-doped N-type silicon substrate 16 having a specific resistivity of $10\Omega$.cm and a face index (100) was placed on a SiC-coated carbon susceptor 15. Then, helium carrier gas was introduced by opening a cock 6 from a helium bomb 1 to a reaction tube 14.

Radio frequency power was applied to water-cooled work coils 13 to heat the SiC-coated carbon susceptor inductively to set the temperature of the substrate 16 to 950° C. Then a cock 8 was opened and diborane ($B_2H_6$) diluted with $H_2$ was introduced from a bomb 3 to the reaction tube. The concentration of diborane was $2 \times 10^{-5}$ mol/min. While on the other hand, hydrogen was introduced by the manipulation of a three-way cock 12 and a cock 11 from a bomb 4 to a bubbler 10 in which liquid phosphorus trichloride ($PCl_3$) 5 was filled to thereby bubble the liquid. The bubbled gas was introduced through a cock 9 to a reaction tube 14. The molar ratio between phosphorus trichloride and diborane $PCl_3/B_2H_6$ was 25. The concentration of phosphorus trichloride was controlled by the changes in the flow rate of bubbling hydrogen carrier and by externally varying the liquid temperature and thus the vapor pressure of liquid phosphorous trichloride. The grown boron phosphide semiconductor device had a film $2\mu$ in thick.

The surface of the grown layer was specular and flat and exhibited a satisfactory crystallinity when tested under the reflecting microelectron diffraction. The layer had a conduction type P, and Hall measurement showed a carrier concentration of $1 \times 10^{19}$ cm$^{-3}$ and a mobility of 5 cm/V.sec.

EXAMPLE 7

A BP/Si composite semiconductor substrate was used as a single crystal semiconductor substrate. The substrate constituted by a boron phosphide single cristal layer formed from hydride composed of phosphine ($PH_3$) and diborane ($B_2H_6$) on a (100) face of an N type silicon substrate. The single crystal layer used had a thickness of between 500-10000 Å. The single crystal layer having a specular and flat surface, when observed under reflecting electron diffraction, showed streaks and Kikuchi's bands demonstrating that it was excellent in crystallinity.

On the above substrate of BP/Si composite semiconductor, was caused to grow a boron phosphide semiconductor layer in $5\mu$ thick in the same procedures as in the Example 6 by supplying gas mixture of hydrogen and helium (He/$H_2$=1) as carrier gas from a helium bomb 1 and a hydrogen bomb 2 by manipulating cocks 6 and 7 at a growing temperature of 1000° C., diborane concentration of $1 \times 10^{-4}$ mol/mm and $PCl_3/B_2H_5$ ratio of 20. The surface of the grown layer was specular and flat and exhibited a satisfactory crystallinity when tested under the reflecting electron diffraction. The surface had a conduction type P and the Hall measurement showed a carrier density of $5 \times 10^{17}$ cm$^{-3}$ and movility of 50 cm/V sec.

As apparent from the Examples 6 and 7, a P type boron phosphide semiconductor layer having a satisfactory crystallinity and excellent both in physical and electrical properties can be produced according to the present invention, which makes a great industrial contribution for the preparation of boron phosphide semiconductor devices.

What is claimed is:

1. A method of doping IIb group elements into a boron phosphide semiconductor on a single crystal silicon substrate comprising heating the substrate at a temperature between about 850° C. and 1100° C.; passing a gas containing boron compounds selected from the group consisting of boron hydrides and boron halides, and phosphorus compounds selected from the group consisting of phosphorus hydrides and phosphorus halides into contact with said substrate; adding organic compounds of IIb group elements to said gas, the mol ratio of said IIb group organic compounds to said boron compounds being about 5.0, said IIb group organic compounds having the general formula:

wherein M is zinc, cadmium or mercury, R is a hydrocarbon radical, and R' is halogen or the same as R.

2. A method as defined in claim 1, wherein said boron compound is diborane, the phosphorus compound is phosphine with a $PH_3/B_2H_6$ mol ratio of about 1:50, and said IIb group organic compound is diethylzinc.

3. A method as defined in claim 1, wherein said boron compound is diborane, the phosphorus compound is phosphine with a $PH_3/B_2H_6$ mol ratio of about 1:50, and said IIb group organic compound is diethylcadmium.

4. A method as defined in claim 1, wherein said boron compound is $B_2H_6$, the phosphorus compound is $PCl_3$ with a $PCl_3/B_2H_6$ mol ratio of about 1:25, and said IIb group organic compound is diethylzinc.

5. A method of doping VIb group elements into a boron phosphide semiconductor on a single crystal silicon substrate which comprises heating the substrate at a temperature between about 850° C. and 1100° C., passing a gas containing borom compounds selected from the group consisting of boron hydrides and boron halides, and phosphorus compounds selected from the group consisting of phosphorus hydrides and phosphorus halides in contact with said substrate, adding hydrides of VIb group elements diluted with $H_2$ to said gas, the mol ratio of said VIb hydrides to said boron compounds being between about 0.067 and 0.67 wherein said hydrides of VIb group elements are selected from the group consisting of $H_2S$, $H_2Se$ or $H_2Te$.

6. A method as defined in claim 5, wherein said boron compound is diborane, the phosphorus compound is phosphine and the $PH_3/B_2H_6$ mol ratio is about 1:50.

7. A method as defined in claim 5, wherein said boron compound is $B_2H_6$, the phosphorus compound is $PCl_3$ and the $PCl_3/B_2H_6$ mol ratio is approximately 1:25.

UNITED STATES PATENT OFFICE
CERTIFICATE OF CORRECTION

Patent No. 4,214,926               Dated  July 29, 1980

Inventor(s)  Nagano Katsuto, et al

It is certified that error appears in the above-identified patent and that said Letters Patent are hereby corrected as shown below:

Column 2, line 65: Delete "include" (1st occurrence).

Column 10, line 15: Replace "borom" by --boron--.

Signed and Sealed this

Thirteenth Day of January 1981

[SEAL]

Attest:

SIDNEY A. DIAMOND

Attesting Officer       Commissioner of Patents and Trademar